US012810952B2

(12) United States Patent
Kwak

(10) Patent No.: US 12,810,952 B2
(45) Date of Patent: Nov. 24, 2026

(54) SEMICONDUCTOR MEMORY DEVICE WITH HOLE-SHARED DUAL STRINGS OPERABLE AS A SINGLE STRING

(71) Applicant: SK hynix Inc., Icheon-si (KR)

(72) Inventor: Dong Hun Kwak, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 120 days.

(21) Appl. No.: 18/363,546

(22) Filed: Aug. 1, 2023

(65) Prior Publication Data

US 2024/0290407 A1 Aug. 29, 2024

(30) Foreign Application Priority Data

Feb. 27, 2023 (KR) ........................ 10-2023-0026110

(51) Int. Cl.
*G11C 16/34* (2006.01)
*G11C 16/04* (2006.01)
*G11C 16/24* (2006.01)

(52) U.S. Cl.
CPC ...... *G11C 16/3495* (2013.01); *G11C 16/0433* (2013.01); *G11C 16/24* (2013.01)

(58) Field of Classification Search
CPC . G11C 16/3495; G11C 16/0433; G11C 16/24; G11C 16/0483; G11C 16/10; G11C 16/26; G11C 11/4074; G11C 11/4085; G11C 11/4094; G11C 8/14; H10B 41/27; H10B 41/40; H10B 41/50; H10B 43/27; H10B 43/40; H10B 43/50
See application file for complete search history.

(56) References Cited

U.S. PATENT DOCUMENTS 4,984,199 A * 1/1991 Yoneda .................... G11C 11/24 365/182
5,592,001 A * 1/1997 Asano ................ G11C 16/3495 365/185.26
7,692,970 B2 * 4/2010 Park ...................... G11C 16/344 365/185.29
10,811,105 B2 * 10/2020 Futatsuyama .......... H10B 43/35
10,950,627 B1 * 3/2021 Hinoue .................. H10B 43/50
2016/0099254 A1 * 4/2016 Park ....................... H10B 41/27 257/324
2020/0183618 A1 * 6/2020 Joe ......................... G11C 16/08
2020/0303382 A1 * 9/2020 Takashima ............ H01L 23/481

FOREIGN PATENT DOCUMENTS

KR 1020200070680 A 6/2020
KR 1020210010210 A 1/2021

* cited by examiner

*Primary Examiner* — Jerome Leboeuf
*Assistant Examiner* — Christopher Lane Reece
(74) *Attorney, Agent, or Firm* — WILLIAM PARK AND ASSOCIATES LTD.

(57) ABSTRACT

Provided herein is a semiconductor memory device. The semiconductor memory device includes first holes arranged in a first direction to be spaced apart from each other by a first distance, a first drain select line coupled to first memory cell strings among first and second memory cell strings separated from each other in each of the first holes, and a second drain select line coupled to the second memory cell strings. Identical data are stored in the first and second memory cells coupled to a selected word line, among memory cells included in each of the first memory cell strings and memory cells included in each of the second memory cell strings.

17 Claims, 13 Drawing Sheets

SEMICONDUCTOR MEMORY DEVICE WITH HOLE-SHARED DUAL STRINGS OPERABLE AS A SINGLE STRING

CROSS-REFERENCE TO RELATED APPLICATION

The present application claims priority under 35 U.S.C. § 119(a) to Korean patent application number 10-2023-0026110 filed on Feb. 27, 2023, in the Korean Intellectual Property Office, the entire disclosure of which is incorporated by reference herein.

BACKGROUND

1. Technical Field

Various embodiments of the present disclosure generally relate to an electronic device, and more particularly to a semiconductor memory device.

2. Related Art

A semiconductor memory device may be formed in a two-dimensional (2D) structure in which strings are horizontally arranged on a semiconductor substrate. Alternatively, the semiconductor memory device may be formed in a three-dimensional (3D) structure in which strings are vertically stacked on a semiconductor substrate. As a memory device having a 2D structure is reaching its physical scaling limit (i.e., limit in the degree of integration), a 3D memory device including a plurality of memory cells vertically stacked on a semiconductor substrate has been produced.

Generally, the 3D memory device may be manufactured such that one memory cell string structure is included in one hole. However, in order to improve the degree of integration of memory cells, the 3D memory device may be manufactured such that two memory cell string structures are included in one hole. In this case, the degree of integration of memory cells is improved, but the operating characteristics of respective memory cells are deteriorated.

SUMMARY

An embodiment of the present disclosure may provide for a semiconductor memory device. The semiconductor memory device may include a plurality of first holes arranged in a first direction to be spaced apart from each other by a first distance, wherein each of the plurality of first holes includes first and second memory cell strings, and wherein each of the plurality of first memory cell strings and each of the plurality of second memory cell strings respectively include a plurality of first memory cells and a plurality of second memory cells, a first drain select line coupled to the plurality of first memory cell strings, among the plurality of first and second memory cell strings, the first memory cell string separated from the second memory cell string in each of the plurality of first holes, and a second drain select line coupled to the plurality of second memory cell strings. The semiconductor memory device may store identical data in the first and second memory cells coupled to a selected word line, among memory cells included in each of the first memory cell strings and memory cells included in each of the second memory cell strings.

An embodiment of the present disclosure may provide for a semiconductor memory device. The semiconductor memory device may include a plurality of memory blocks, each including a plurality of first holes arranged in a first direction to be spaced apart from each other by a first distance, wherein each of the plurality of first holes includes a first and a second memory cell strings, and wherein each of the plurality of first memory cell strings and each of the plurality of second memory cell strings respectively include a plurality of first memory cells and a plurality of second memory cells, a peripheral circuit configured to perform a program operation or a read operation on a memory block selected from among the plurality of memory blocks, and a control logic configured to control an operation of the peripheral circuit. The first memory cell strings may be coupled to a first drain select line, among the plurality of first and second memory cell strings, the first memory cell string separated from the second memory cell string in each of the plurality of first holes. The second memory cell strings may be coupled to a second drain select line. The control logic may be configured to control the peripheral circuit to store identical data in first and second memory cells coupled to a selected word line among memory cells included in first and second memory cell strings of the selected memory block.

An embodiment of the present disclosure may provide for a semiconductor memory device. The semiconductor memory device may include a plurality of first holes arranged in a first direction to be spaced apart from each other by a first distance, and a plurality of second holes arranged in the first direction to be spaced apart from each other by the first distance. The plurality of second holes may be arranged to be spaced apart from the plurality of first holes in a second direction that is perpendicular to the first direction and are arranged to be offset from the plurality of first holes in the first direction by a third distance. Each of the plurality of first holes may be separated into first and second memory cell strings, the first memory cell strings may be coupled to a first drain select line, the second memory cell strings may be coupled to a second drain select line, and the first and second memory cell strings may be coupled to odd-numbered bit lines. Each of the second holes may be separated into third and fourth memory cell strings, the third memory cell strings may be coupled to the second drain select line, the fourth memory cell strings may be coupled to a third drain select line, and the third and fourth memory cell strings may be coupled to even-numbered bit lines. During an operation performed on the first and second memory cell strings, the first drain select line, the second drain select line, and the odd-numbered bit lines may be activated. During an operation on the third and fourth memory cell strings, the second drain select line, the third drain select line, and the even-numbered bit lines may be activated.

An embodiment of the present disclosure may provide for a semiconductor memory device. The semiconductor memory device may include a plurality of first holes arranged in a first direction to be spaced apart from each other by a first distance, wherein each of the plurality of first holes includes first and second memory cell strings, and a plurality of second holes that are offset in relation to the plurality of first holes, wherein each of the plurality of second holes includes third and fourth memory cell strings. An operation may be performed on different memory cell strings based on which drain select lines and bit lines are activated.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms and should not be construed as being limited to the embodiments described in the specification or application.

Various embodiments of the present disclosure are directed to a semiconductor memory device, which has improved operational stability while improving the degree of integration of memory cells.

Figure 1:
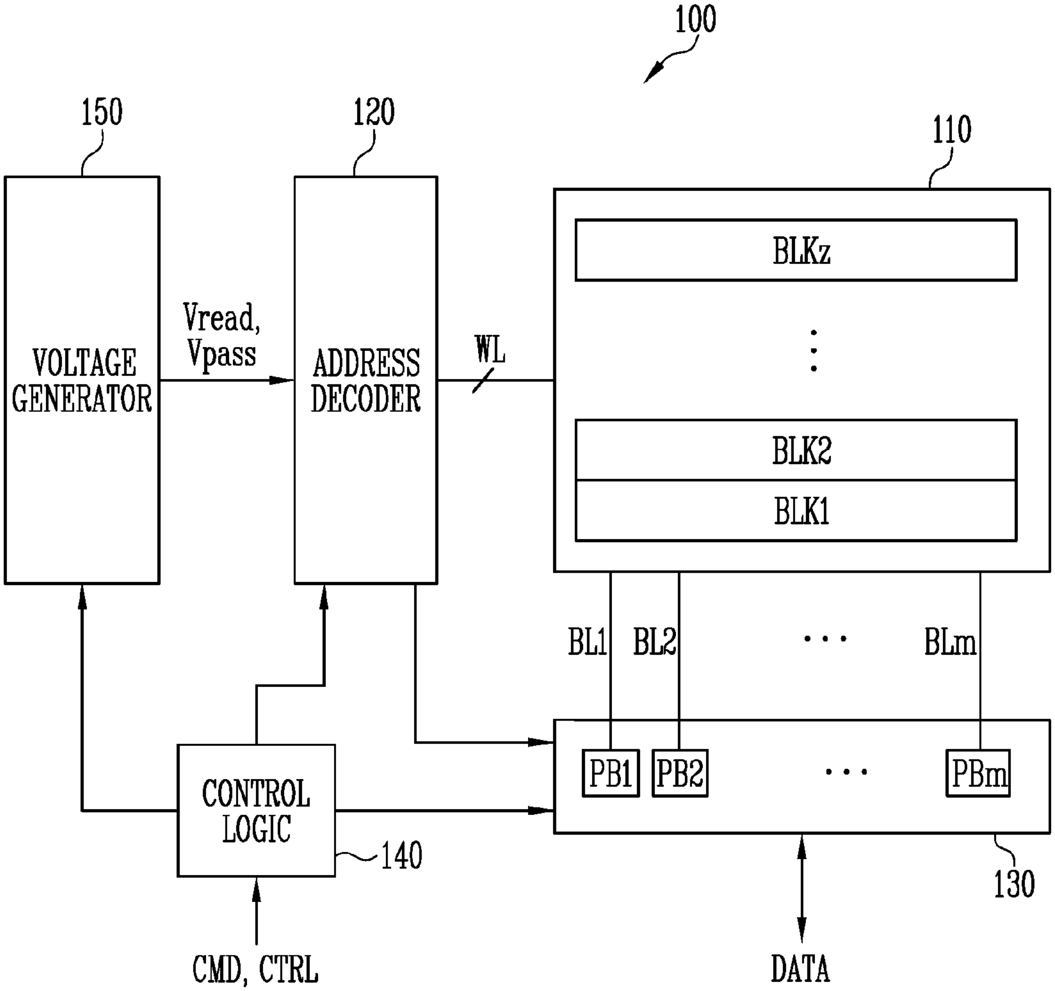
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 may include a memory cell array 110, an address decoder 120, a read and write circuit 130, a control logic 140, and a voltage generator 150.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read and write circuit 130 through bit lines BL1 to BLm. Each of the memory blocks BLK1 to BLKz may include a plurality of memory cells. In an embodiment, the plurality of memory cells may be nonvolatile memory cells and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure. Meanwhile, each of the memory cells included in the memory cell array may store at least one bit of data. In an embodiment, each of the memory cells included in the memory cell array 110 may be a single-level cell (SLC), which stores one bit of data. In an embodiment, each of the memory cells included in the memory cell array 110 may be a multi-level cell (MLC), which stores 2 bits of data. In an embodiment, each of the memory cells included in the memory cell array 110 may be a triple-level cell (TLC), which stores 3 bits of data. In an embodiment, each of the memory cells included in the memory cell array 110 may be a quad-level cell (QLC), which stores 4 bits of data. In accordance with an embodiment, the memory cell array 110 may include a plurality of memory cells, each of which stores 5 or more bits of data.

The address decoder 120, the read and write circuit 130, and the voltage generator 150 may be operated as a peripheral circuit for driving the memory cell array 110. The peripheral circuit may perform a read operation, a write operation, and an erase operation on the memory cell array 110 under the control of the control logic 140. The address decoder 120 may be coupled to the memory cell array 110 through the word lines WL. The address decoder 120 may be operated under the control of the control logic 140. The address decoder 120 may receive addresses through an input/output buffer (not illustrated) provided in the semiconductor memory device 100.

The address decoder 120 may decode a block address, among the received addresses. The address decoder 120 may select at least one memory block according to the decoded block address. Further, when a read voltage apply operation is performed during a read operation, the address decoder 120 may apply a read voltage Vread, generated by the voltage generator 150, to a selected word line of a selected memory block and may apply a pass voltage Vpass to the remaining word lines, that is, unselected word lines. Further, during a program verify operation, the address decoder 120 may apply a verify voltage, generated by the voltage generator 150, to the selected word line of the selected memory block and may apply the pass voltage Vpass to the remaining word lines, that is, unselected word lines.

The address decoder 120 may decode the column address, among the received addresses. The address decoder 120 may transmit the decoded column address to the read and write circuit 130.

Each of the read and program operations of the semiconductor memory device 100 may be performed on a page-by-page basis. Addresses received in response to requests for the read and program operations may include a block address, a row address, and a column address. The address decoder 120 may select one memory block and one word line in accordance with the block address and the row address. The column address may be decoded by the address decoder 120 and may then be provided to the read and write circuit 130.

The address decoder 120 may include a block decoder, a row decoder, a column decoder, an address buffer, etc.

The read and write circuit 130 may include a plurality of page buffers PB1 to PBm. The read and write circuit 130 may be operated as a "read circuit" during a read operation on the memory cell array 110 and as a "write circuit" during a write operation on the memory cell array 110. The plurality of page buffers PB1 to PBm may be coupled to the memory cell array 110 through the bit lines BL1 to BLm. In order to sense the threshold voltages of the memory cells during a read operation and a program verify operation, each of the page buffers PB1 to PBm may sense, through a sensing node, a change in the amount of flowing current based on the program state of the corresponding memory cell and may latch the sensed change as sensing data while continuously supplying a sensing current to the bit lines coupled to the memory cells. The read and write circuit 130 may be operated in response to page buffer control signals output from the control logic 140.

During a read operation, the read and write circuit 130 may sense data stored in the memory cells and temporarily store read data and may then output data DATA to the input/output buffer (not illustrated) of the semiconductor memory device 100. In an embodiment, the read and write circuit 130 may include a column select circuit or the like in addition to the page buffers (or page registers).

The control logic 140 may be coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. Also, the control logic 140 may output a control signal for controlling the precharge potential level of a sensing node in each of the plurality of page buffers PB1 to PBm. The control logic 140 may control the read and write circuit 130 to perform a read operation on the memory cell array 110.

The voltage generator 150 may generate the read voltage Vread and the pass voltage Vpass required for a read operation in response to the control signal output from the control logic 140. The voltage generator 150 may include a plurality of pumping capacitors for receiving the internal supply voltage so as to generate a plurality of voltages having various voltage levels and may generate a plurality of voltages by selectively enabling the plurality of pumping capacitors under the control of the control logic 140.

Figure 2:
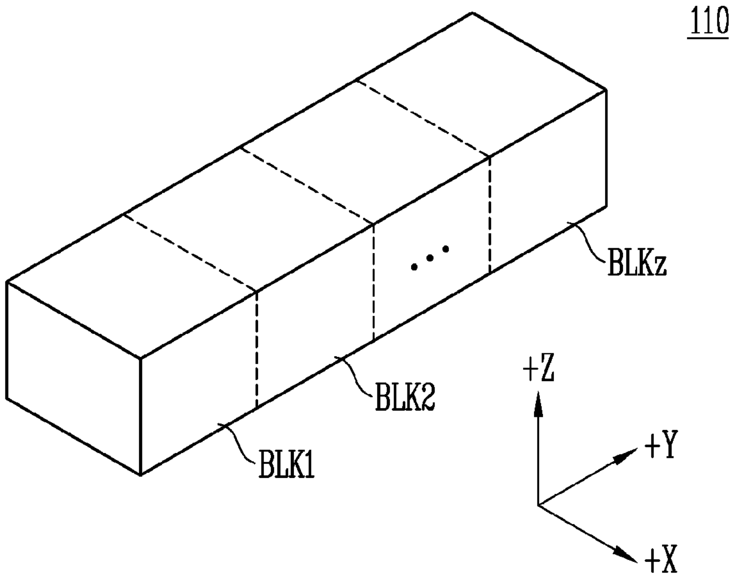
FIG. 2 is a diagram illustrating an embodiment of a memory cell array of FIG. 1.

FIG. 2 is a diagram illustrating an embodiment of the memory cell array of FIG. 1.

Referring to FIG. 2, the memory cell array 110 may include a plurality of memory blocks BLK1 to BLKz. Each of the memory blocks may have a three-dimensional (3D) structure. Each of the memory blocks may include a plurality of memory cells stacked on a substrate. The plurality of memory cells may be arranged in +X, +Y, and +Z directions.

Each of the memory blocks BLK1 to BLKz may include a common source line, bit lines, memory cell strings electrically connected to the common source line and the bit lines, word lines electrically connected to the memory cell strings, and select lines electrically connected to the memory cell strings. Each of the memory cell strings may include memory cells and select transistors that are connected in series to each other through a channel pattern. The select lines and the word lines may be used as gate electrodes of the select transistors and the memory cells.

Figure 3:
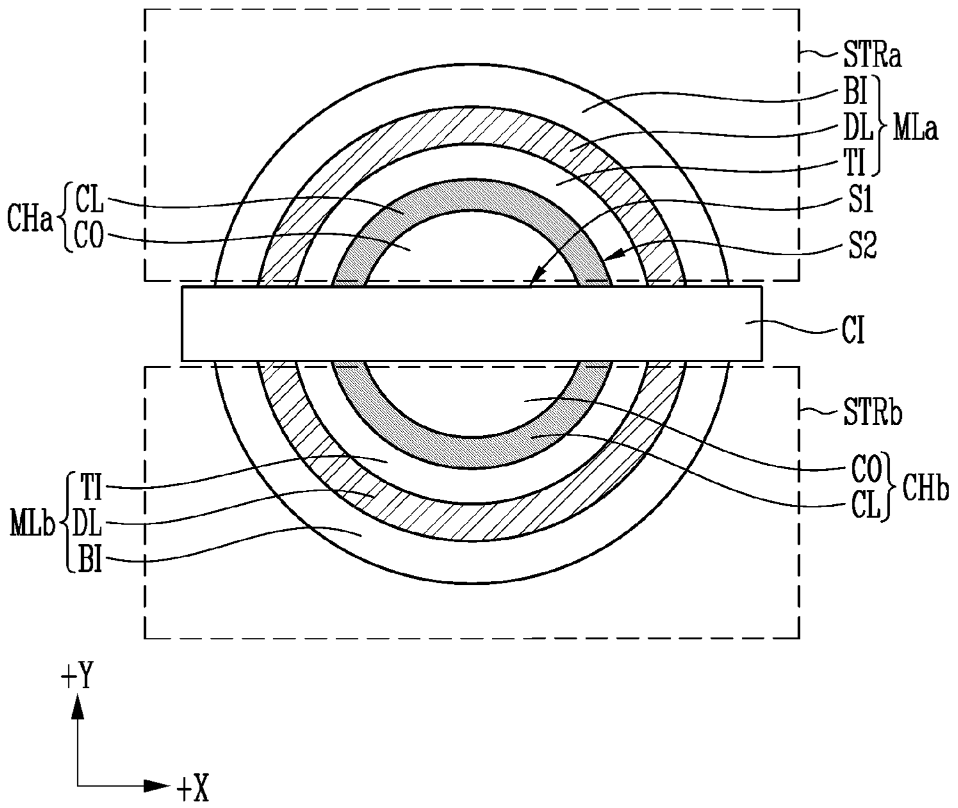
FIG. 3 illustrates two memory cell string structures formed in one hole in a first direction (e.g., +Z direction) according to an embodiment of the present disclosure.

FIG. 3 illustrates two memory cell string structures formed in one hole in a first direction (e.g., +Z direction) according to an embodiment of the present disclosure.

Referring to FIG. 3, two memory cell string structures may be formed in one hole. In detail, a first memory cell string STRa and a second memory cell string STRb may be separated from each other by a channel isolation pattern CI formed in a positive X (+X) direction to distinguish regions in the hole from each other. The first memory cell string STRa may include memory cells and select transistors that are connected in series by a first channel pattern CHa, and the second memory cell string STRb may include memory cells and select transistors that are connected in series by a second channel pattern CHb. The channel isolation pattern CI may be made of an insulating material.

As illustrated in FIG. 3, the first and second memory cell strings STRa and STRb may be formed through one hole. Each of the first channel pattern CHa and the second channel pattern CHb may include a first sidewall S1 facing the central region of the hole and a second sidewall S2 facing the sidewall of the hole. The second sidewall S2 may have a greater curvature than the first sidewall S1 that is formed to be coplanar with the sidewall of the channel isolation pattern CI. For example, the first sidewall S1 may be formed to be substantially flat.

Each of the first channel pattern CHa and the second channel pattern CHb may include a core insulating layer CO and a channel layer CL. The core insulating layer CO may include a first sidewall formed to be coplanar with the sidewall of the channel isolation pattern CI and a second sidewall enclosed by the channel layer CL. The channel layer CL may include a semiconductor material that may be used as a channel region.

Each of a first memory pattern MLa and a second memory pattern MLb may include a tunnel insulating layer TI formed on the sidewall of the channel layer CL, a data storage layer DL formed on the sidewall of the tunnel insulating layer TI, and a blocking insulating layer BI formed on the sidewall of the data storage layer DL. The data storage layer DL may be formed of a material layer capable of storing changed data by using Fowler-Nordheim tunneling. For this, the data storage layer DL may be formed of various materials, for example, a charge trap layer. The charge trap layer may include a nitride layer. However, the present disclosure is not limited thereto, and the data storage layer DL may include a phase change material, nanodots, etc. The blocking insulating layer BI may include an oxide layer capable of blocking charges. The tunnel insulating layer TI may be formed of a silicon oxide layer enabling charge tunneling.

In an embodiment, as illustrated in FIG. 3, each of the tunnel insulating layer TI, the data storage layer DL, and the blocking insulating layer BI may be separated into the first memory pattern MLa and the second memory pattern MLb by the channel isolation pattern CI.

Figure 4:
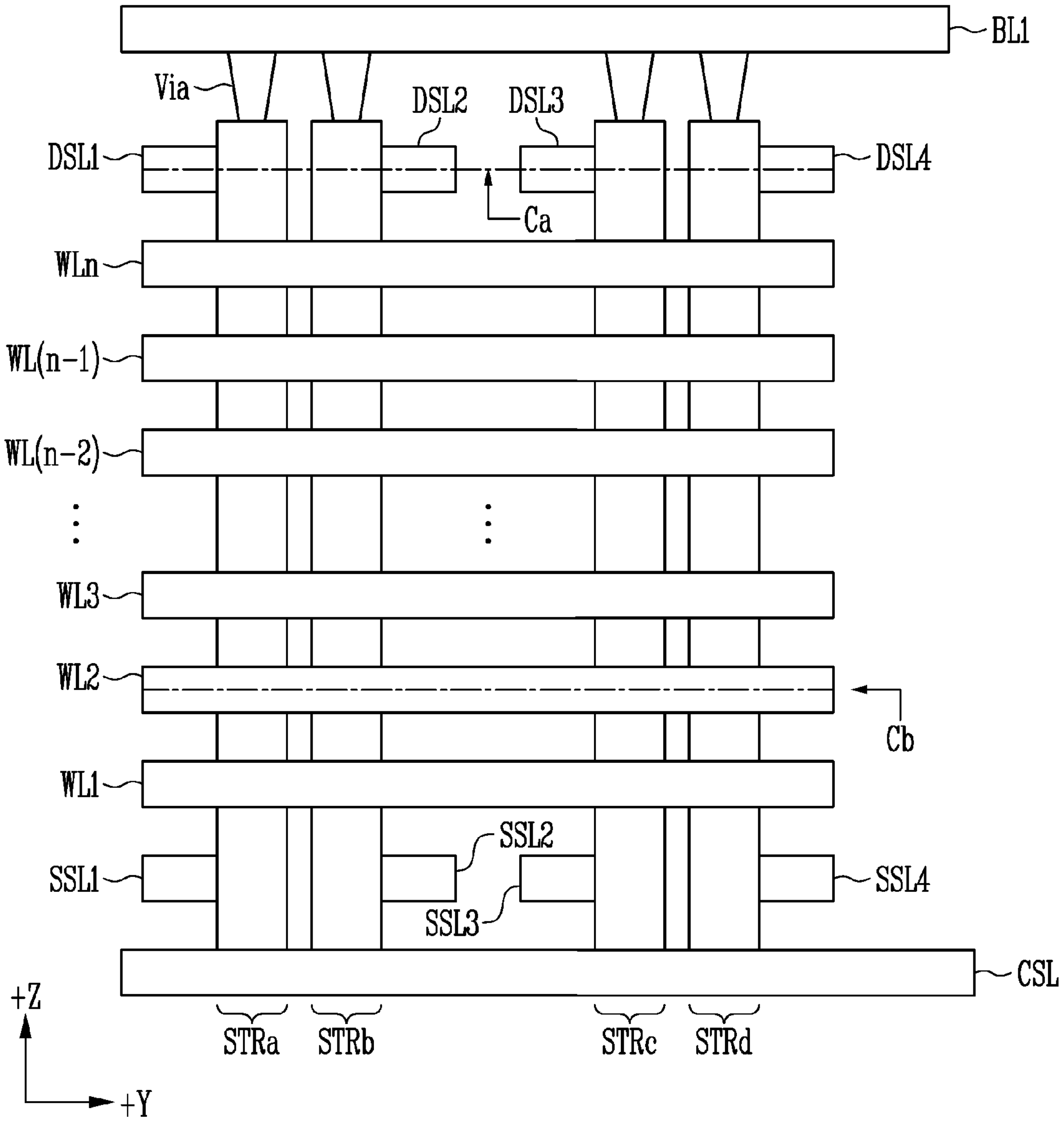
FIG. 4 illustrates two memory cell string structures formed in one hole in a second direction (e.g., +X direction) according to an embodiment of the present disclosure.

FIG. 4 illustrates two memory cell string structures formed in one hole in a second direction (e.g., +X direction) according to an embodiment of the present disclosure. In an example, in FIG. 4, memory cell strings coupled to a first bit line BL1 are illustrated.

Referring to FIG. 4, four memory cell strings STRa, STRb, STRc, and STRd are illustrated. The first and second memory cell strings STRa and STRb may be formed in one hole, and the third and fourth memory cells strings STRc and STRd may also be formed in one additional hole. For example, the first and second memory cell strings STRa and STRb of FIG. 4 may be the first and second memory cell strings as illustrated in FIG. 3. The memory cell strings may be formed on a common source line CSL.

First to fourth source select lines SSL1, SSL2, SSL3, and SSL4 may be formed on the common source line CSL. The first to fourth source select lines SSL1, SSL2, SSL3, and SSL4 may function as the gate electrodes of the source select transistors of the first to fourth memory cell strings STRa, STRb, STRc, and STRd, respectively.

Although an embodiment in which respective memory cell strings STRa, STRb, STRc, and STRd are connected to different source select lines SSL1, SSL2, SSL3, and SSL4 is illustrated in FIG. 4, the present disclosure is not limited thereto. For example, in accordance with an embodiment, the source select transistors of the first to fourth memory cell strings STRa, STRb, STRc, and STRd may be coupled to one source select line.

A plurality of word lines WL1 to WLn may be formed on the first to fourth source select lines SSL1, SSL2, SSL3, and SSL4. The word lines may be coupled in common to the memory cell strings. For example, the second word line WL2 may be coupled in common to the first to fourth memory cell strings STRa, STRb, STRc, and STRd.

Meanwhile, first to fourth drain select lines DSL1, DSL2, DSL3, and DSL4 may be formed on the word lines. The first to fourth drain select lines DSL1, DSSL2, DSL3, and DSL4 may function as the gate electrodes of drain select transistors of the first to fourth memory cell strings STRa, STRb, STRc, and STRd, respectively.

A first bit line BL1 may be coupled to the top of the first to fourth drain select lines DSL1, DSL2, DSL3, and DSL4. The first to fourth memory cell strings STRa, STRb, STRc, and STRd may be coupled to the first bit line BL1 through vias.

Figure 5:
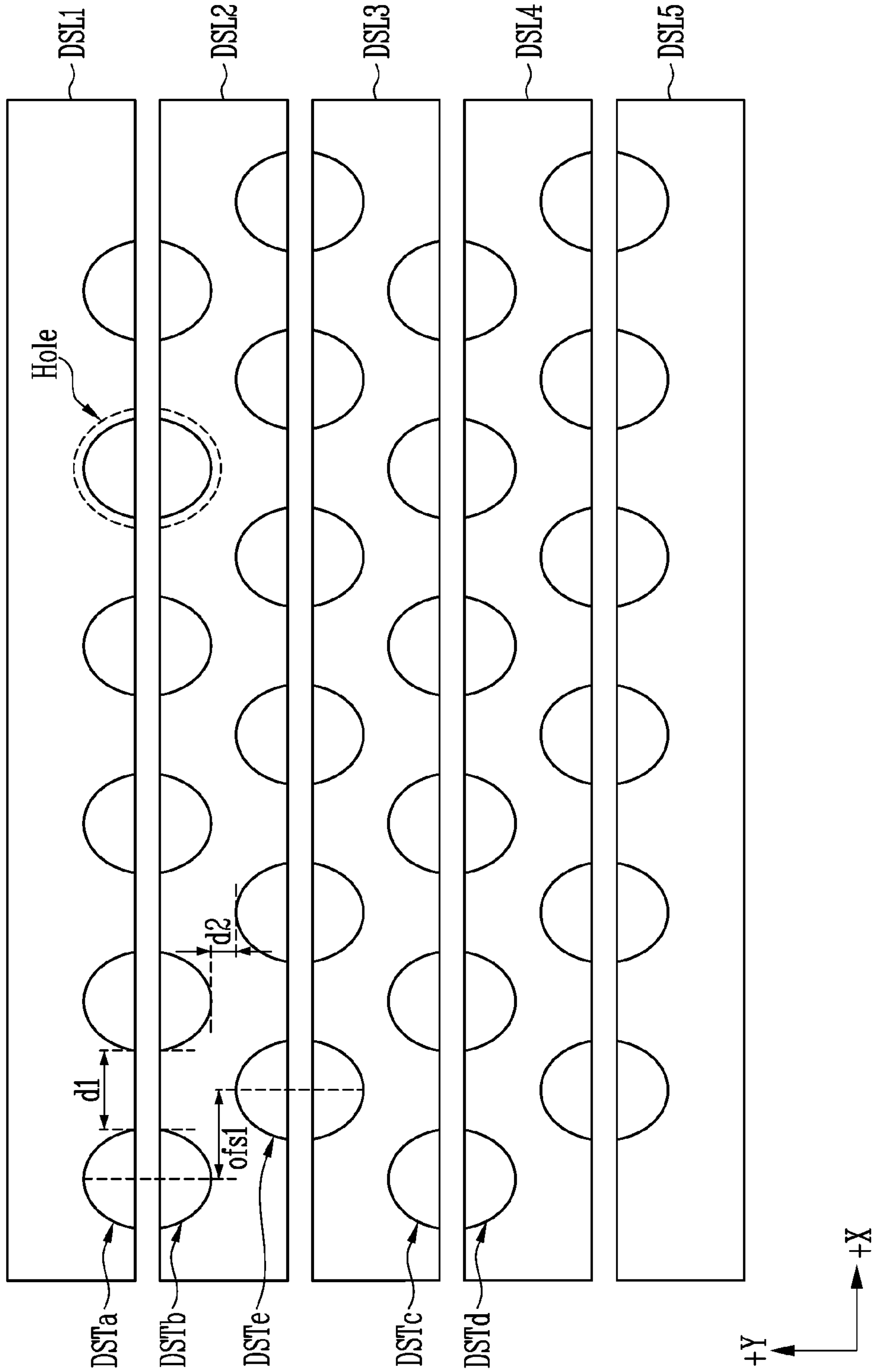
FIG. 5 illustrates the cross section (Ca) of FIG. 4 viewed from a first direction (e.g., +Z direction).

FIG. 5 illustrates the cross section (Ca) of FIG. 4 viewed from a first direction (e.g., +Z direction).

Referring to FIG. 5, an arrangement structure in which memory cell strings formed in a plurality of holes are viewed from the +Z direction is illustrated. In order to improve the degree of integration of memory cell strings, holes in which memory cell strings are to be formed may be arranged in a zigzag shape.

More specifically, holes in a first row, formed in common in the first and second drain select lines DSL1 and DSL2, may be arranged in a +X direction. The holes in the first row may be regularly arranged in the +X direction while being spaced apart from each other by a first distance d1. In each of the holes in the first row, two memory cell strings may be formed. For example, in the leftmost hole, among the holes in the first row, the first and second memory cell strings may be formed. Because FIG. 5 illustrates the cross section (Ca) of FIG. 4, a first drain select transistor DSTa and a second drain select transistor DSTb may be formed in the holes in the first row on the cross section (Ca).

One of the two memory cell strings formed in each of the holes in the first row may be coupled to the first drain select line DSL1, and the other of the two memory cell strings formed in each of the holes in the first row may be coupled to the second drain select line DSL2. The two memory cell strings formed in each of the holes in the first row may be independently controlled by selectively activating the first and second drain select lines DSL1 and DSL2.

Meanwhile, holes in a second row, formed in common in the second and third drain select lines DSL2 and DSL3, may also be arranged in the +X direction while being spaced apart from each other by the first distance d1. The holes in the second row are arranged to be spaced apart from the holes in the first row in a −Y direction by a second distance d2. Further, the holes in the second row may be arranged to be offset from the holes in the first row by a first offset distance ofs1 in the +X direction. In other words, the difference between the center of the leftmost hole in the first row and the center of the leftmost hole in the second row may be the first offset distance ofs1 in the X direction.

One of the two memory cell strings formed in each of the holes in the second row may be coupled to the second drain select line DSL2, and the other of the two memory cell strings formed in each of the holes in the second row may be coupled to the third drain select line DSL3. The two memory cell strings formed in each of the holes in the second row may be independently controlled by selectively activating the second and third drain select lines DSL2 and DSL3.

Furthermore, holes in a third row, formed in common in the third and fourth drain select lines DSL3 and DSL4, may also be arranged in the +X direction while being spaced apart from each other by the first distance d1. The holes in the third row are arranged to be spaced apart from the holes in the second row in the −Y direction by the second distance d2. Furthermore, the holes in the third row may be arranged to be offset from the holes in the second row by the first offset distance ofs1 in a −X direction. In other words, the difference between the center of the leftmost hole in the second row and the center of the leftmost hole in the third row may be the first offset distance ofs1 in the X direction.

Therefore, the holes in the third row and the holes in the first row might not be arranged to be offset from each other in the X direction. In other words, the center of the leftmost hole in the first row may be aligned with the center of the leftmost hole in the third row in the X direction.

One of the two memory cell strings formed in each of the holes in the third row may be coupled to the third drain select line DSL3, and the other of the two memory cell strings formed in each of the holes in the third row may be coupled to the fourth drain select line DSL4. The two memory cell strings formed in each of the holes in the third row may be independently controlled by selectively activating the third and fourth drain select lines DSL3 and DSL4.

For example, in the leftmost hole, among the holes in the third row, the third and fourth memory cell strings may be formed. Because FIG. 5 illustrates the cross section (Ca) of FIG. 4, a third drain select transistor DSTc and a fourth drain select transistor DSTd may be formed in the holes in the third row in the cross section (Ca).

Meanwhile, a fifth drain select transistor DSTe may be formed in the leftmost hole, among the holes in the second row.

As illustrated in FIG. 5, the distance between holes formed in the same area may be maximized through a zigzag arrangement scheme in which holes are arranged in such a way that an offset is alternately applied to the holes formed in respective rows.

Figure 6:
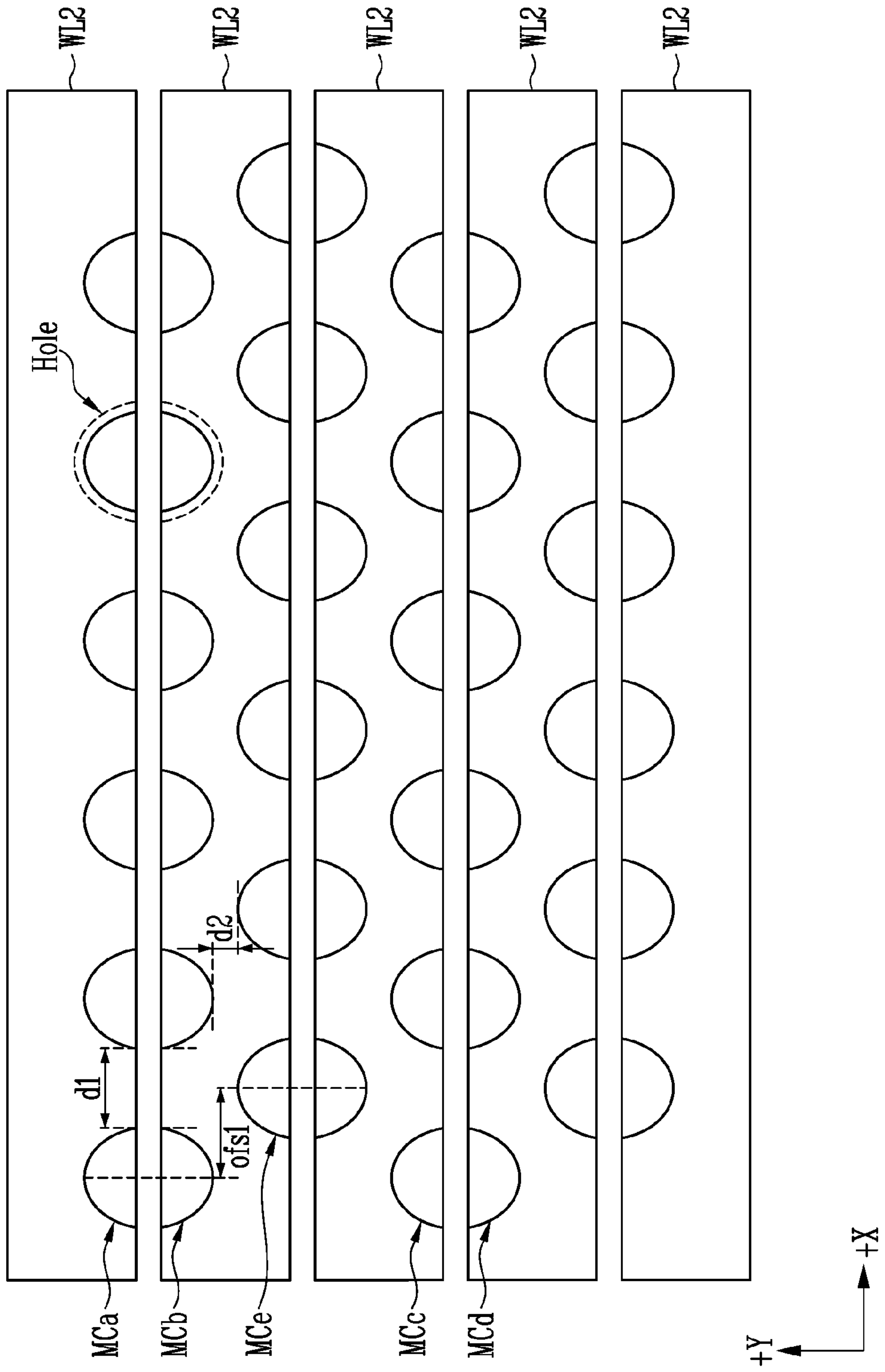
FIG. 6 illustrates the cross section (Cb) of FIG. 4 viewed from the first direction (e.g., +Z direction).

FIG. 6 illustrates the cross section (Cb) of FIG. 4 viewed from the first direction (e.g., +Z direction).

Referring to FIG. 6, an arrangement structure in which memory cell strings formed in a plurality of holes are viewed from the +Z direction is illustrated. In detail, in FIG. 6, the arrangement of memory cell strings at the position of a second word line WL2 is illustrated.

As described above, holes in a first row may be regularly arranged in a +X direction while being spaced apart from each other by a first distance d1. In each of the holes in the first row, two memory cell strings may be formed. For example, in the leftmost hole, among the holes in the first row, the first and second memory cell strings may be formed. Because the cross section (Cb) of FIG. 4 is illustrated in FIG. 6, a first memory cell MCa and a second memory cell MCb may be formed in the holes in the first row on the cross section (Cb).

Meanwhile, holes in a second row may also be arranged in the +X direction to be spaced apart from each other by the first distance d1. However, the holes in the second row may be arranged to be spaced apart from the holes in the first row in a −Y direction by a second distance d2, and the holes in the second row may be arranged to be offset from the holes in the first row by a first offset distance ofs1 in the +X direction. In other words, the difference between the center of the leftmost hole in the first row and the center of the leftmost hole in the second row may be the first offset distance ofs1 in the X direction.

Furthermore, holes in a third row may also be arranged in the +X direction to be spaced apart from each other by the first distance d1. However, the holes in the third row may be arranged to be spaced apart from the holes in the second row in the −Y direction by the second distance d2, and the holes in the third row may be arranged to be offset from the holes in the second row by the first offset distance ofs1 in a −X direction. That is, the difference between the center of the leftmost hole in the second row and the center of the leftmost hole in the third row may be the first offset distance ofs1 in the X direction.

Therefore, the holes in the third row and the holes in the first row might not be arranged to be offset from each other in the X direction. That is, the center of the leftmost hole in the first row may be aligned with the center of the leftmost hole in the third row in the X direction.

For example, in the leftmost hole, among the holes in the third row, the third and fourth memory cell strings may be formed. Because the cross section (Cb) of FIG. 4 is illustrated in FIG. 6, a third memory cell MCc and a fourth memory cell MCd may be formed in the holes in the third row in the cross section (Cb). Meanwhile, a fifth memory cell MCe may be formed in the leftmost hole, among the holes in the second row.

The memory cells illustrated in FIG. 6 may be coupled in common to the second word line WL2.

As illustrated in FIG. 6, the distance between holes formed in the same area may be maximized through a zigzag arrangement scheme in which holes are arranged in such a way that an offset is alternately applied to the holes formed in respective rows.

Figure 7:
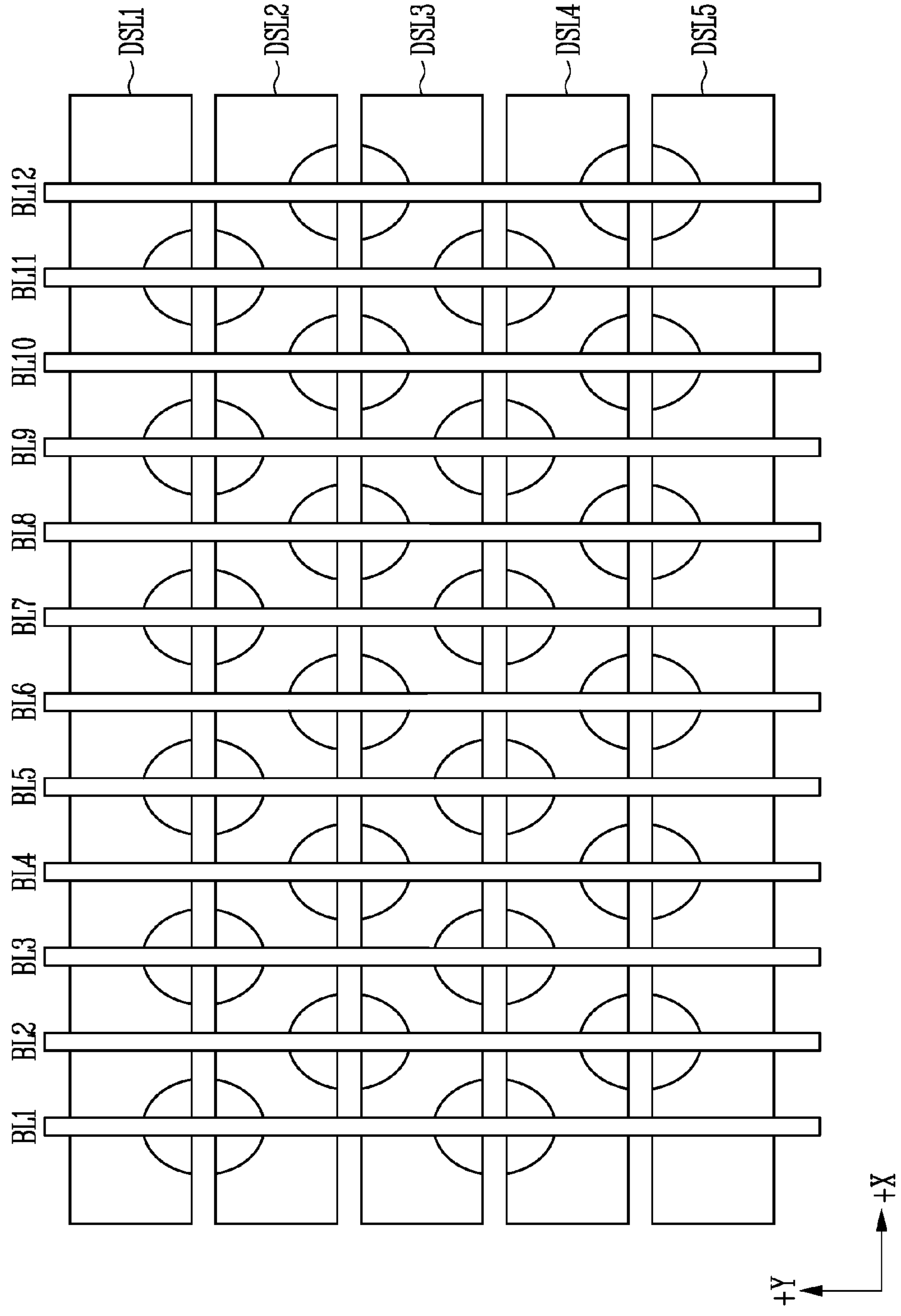
FIG. 7 illustrates a connection relation between drain select transistors included in respective memory cell strings and bit lines.

FIG. 7 illustrates a connection relation between drain select transistors included in respective memory cell strings and bit lines.

Referring to FIG. 7, bit lines arranged on respective memory cell strings are illustrated. In an embodiment, the bit lines may be arranged in a +Y direction.

As described above, in accordance with an embodiment of the present disclosure, holes in which memory cell strings are formed may be arranged in a zigzag shape, and thus, bit lines coupled to the holes may be different from each other in respective rows. In detail, referring to FIG. 7, odd-numbered bit lines BL1, BL3, BL5, BL7, BL9, and BL11 may be coupled to holes in a first row, and even-numbered bit lines BL2, BL4, BL6, BL8, BL10, and BL12 may be coupled to holes in a second row. Further, the odd-numbered bit lines BL1, BL3, BL5, BL7, BL9, and BL11 may be coupled to holes in a third row, and the even-numbered bit lines BL2, BL4, BL6, BL8, BL10, and BL12 may be coupled to holes in a fourth row.

In other words, the odd-numbered bit lines BL1, BL3, BL5, BL7, BL9, and BL11 may be coupled to the holes in odd-numbered rows, and the even-numbered bit lines BL2, BL4, BL6, BL8, BL10, and BL12 may be coupled to holes in even-numbered rows.

Figure 8A:
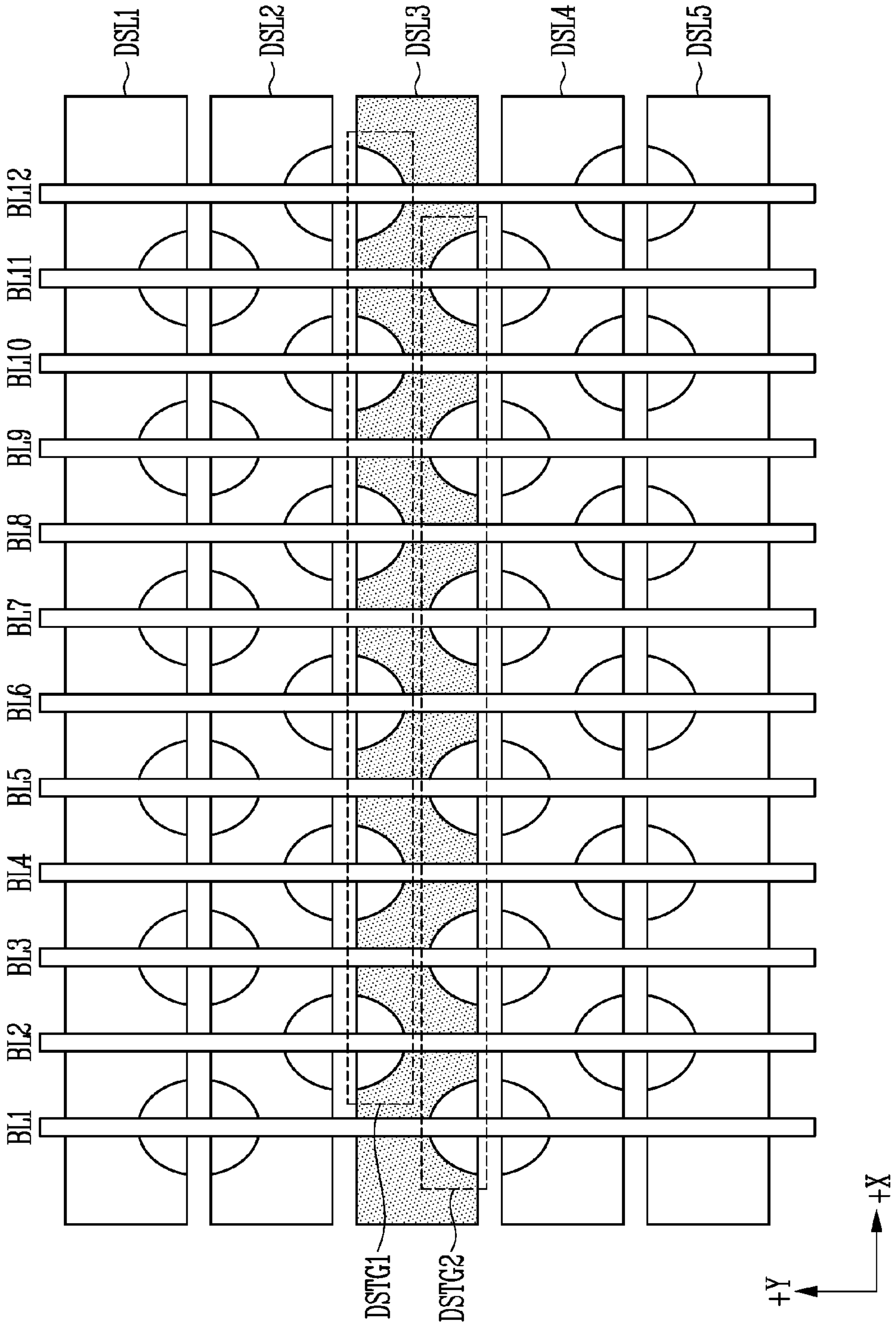
FIG. 8A illustrates memory cell strings selected by a third drain select line DSL3.

FIG. 8A illustrates memory cell strings selected by a third drain select line DSL3.

Referring to FIG. 8A, when the third drain select line DSL3 is activated, drain select transistors formed in the third drain select line DSL3 may be selected. That is, when a turn-on voltage is applied to the third drain select line DSL3, drain select transistors DSTG1 coupled to the third drain select line DSL3, among drain select transistors included in respective holes in the second row, may be turned on. Further, among the drain select transistors included in respective holes in the third row, drain select transistors DSTG2 coupled to the third drain select line DSL3 may be turned on. In other words, the drain select transistors DSTG1 and DSTG2, coupled to the third drain select line DSL3, may be selected by applying the turn-on voltage to the third drain select line DSL3 and applying the turn-off voltage to the remaining drain select lines. Therefore, an operation, e.g., a read operation or a program operation, on memory cell strings including each of the drain select transistors DSTG1 and DSTG2 coupled to the third drain select line DSL3 may be performed.

Figure 8B:
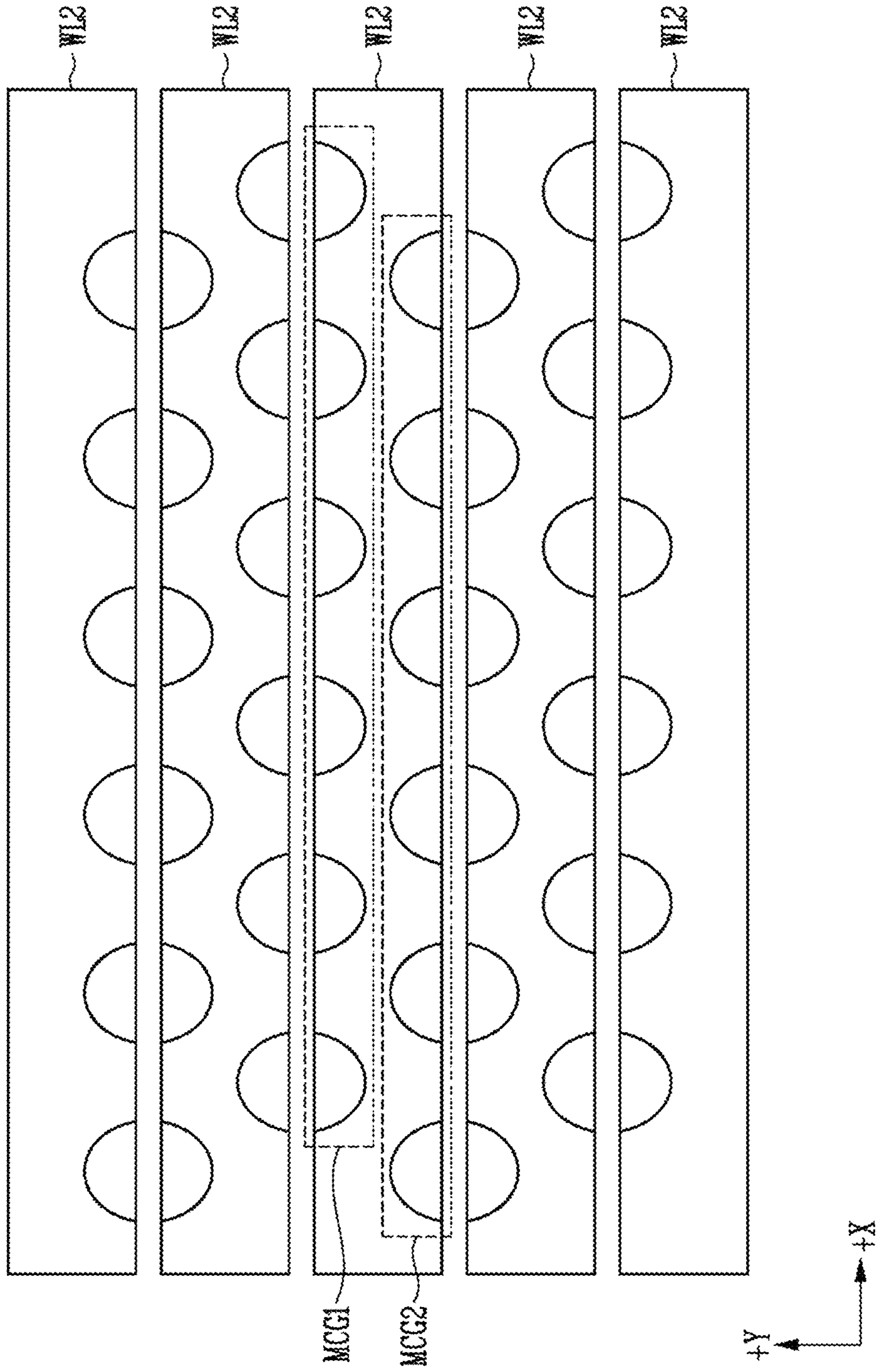
FIG. 8B illustrates memory cells in memory cell strings selected by the third drain select line DSL3.

FIG. 8B illustrates memory cells in memory cell strings selected by the third drain select line DSL3.

When the turn-on voltage is applied to the third drain select line DSL3, the turn-off voltage may be applied to the remaining drain select lines. Furthermore, when the second word line WL2 is selected, memory cells MCG1 and MCG2 respectively corresponding to the drain select transistors DSTG1 and DSTG2 coupled to the third drain select line DSL3, among all memory cells coupled to the second word line WL2, may be selected as the target of operation. In this way, two memory cell strings formed in each of holes arranged in a zigzag shape may be individually controlled. Accordingly, the degree of integration of memory cell strings may be improved within a limited area.

However, although the degree of integration of memory cells may be improved when two memory cell strings are formed in each of the holes, the operational stability of the memory cell strings may be deteriorated. For example, when two memory cell strings are formed in one hole, cell deterioration characteristics may be rapidly intensified as time lapses.

According to the semiconductor memory device according to an embodiment of the present disclosure, two memory cell strings formed in one hole may be used as one memory cell string as necessary. That is, the semiconductor memory device may store the same data in two memory cells formed in one hole and may simultaneously read the data from the memory cells, thus operating the two memory cells as if they were one memory cell.

Figure 9A:
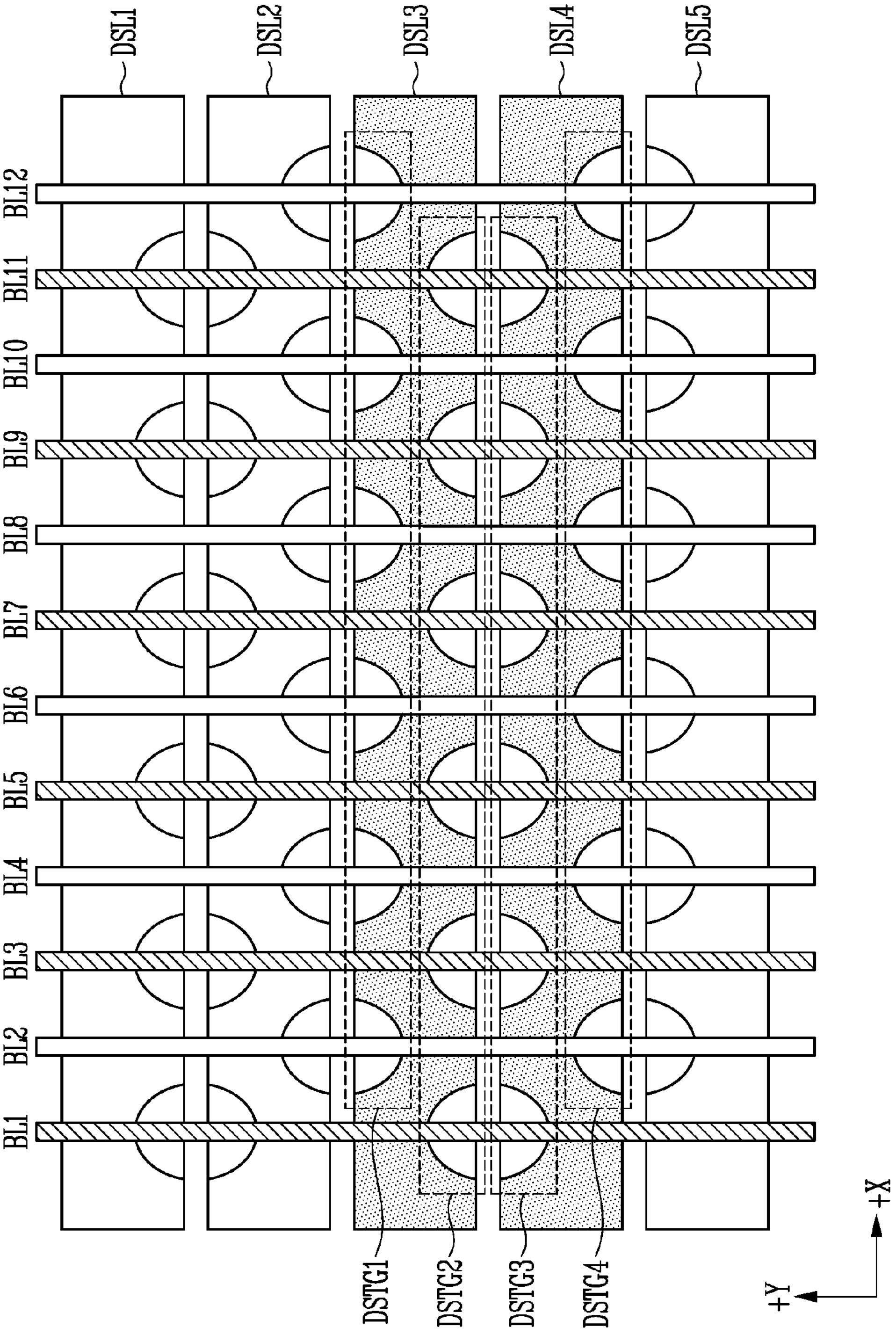
FIG. 9A illustrates a drain select line activated to store the same data in a memory cell pair included in two memory cell strings formed in one hole and odd-numbered bit lines corresponding to the drain select line.
Figure 9B:
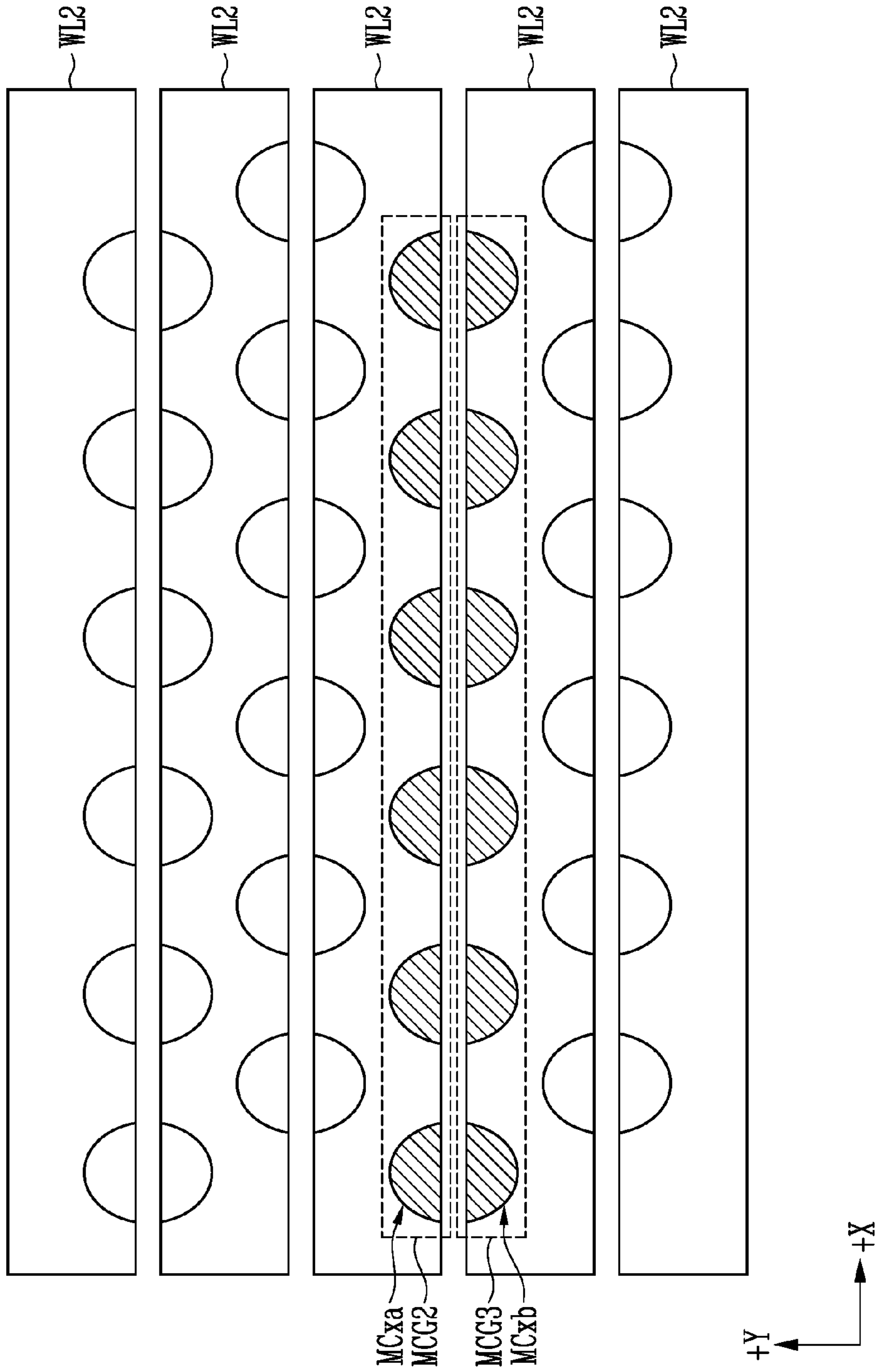
FIG. 9B illustrates memory cells selected by an activated drain select line and activated bit lines in FIG. 9A.

FIG. 9A illustrates a drain select line activated to store the same data in a memory cell pair included in two memory cell strings formed in one hole and odd-numbered bit lines corresponding to the drain select line. FIG. 9B illustrates memory cells selected by an activated drain select line and activated bit lines in FIG. 9A. Hereinafter, description will be made with reference to both FIGS. 9A and 9B.

For example, when two memory cell strings formed in each of the holes in a third row, among holes illustrated in FIG. 9A, are to be operated as if they were one memory cell string, a third drain select line DSL3 and a fourth drain select line DSL4 need to be first selected. In this case, all memory cell strings formed in the holes in the third row may be activated. That is, all of the drain select transistors DSTG2 and DSTG3 formed in the holes in the third row may be turned on.

However, among drain select transistors formed in holes in a second row, the drain select transistors DSTG1 adjacent to the third drain select line DSL3 and drain select transistors DSTG4 adjacent to the fourth drain select line DSL4, among drain select transistors formed in holes in a fourth row, may also be turned on.

In order to deactivate memory cells coupled to the drain select transistors DSTG1 and DSTG4, without deactivating the drain select transistors DSTG2 and DSTG3 formed in the holes in the third row, among the drain select transistors DSTG1, DSTG2, DSTG3, and DSTG4 coupled to the third and fourth drain select lines DSL3 and DSL4, the bit lines may be selectively activated.

In detail, odd-numbered bit lines BL1, BL3, BL5, BL7, BL9, and BL11 may be coupled to the holes in the third row, and even-numbered bit lines BL2, BL4, BL6, BL8, BL10, and BL12 may be coupled to holes in the second and fourth rows. Therefore, in order to activate the memory cell strings formed in the holes in the third row, only the odd-numbered bit lines BL1, BL3, BL5, BL7, BL9, and BL11 may be activated. As the even-numbered bit lines BL2, BL4, BL6, BL8, BL10, and BL12 are deactivated, an operation might not be performed on the memory cells coupled to the drain select transistors DSTG1 and DSTG4 even though the drain select transistors DSTG1 and DSTG4 are turned on.

In other words, as illustrated in FIG. 9B, in the case in which the second word line WL2 is selected, when the turn-on voltage is applied to the third and fourth drain select lines DSL3 and DSL4 and the odd-numbered bit lines BL1, BL3, BL5, BL7, BL9, and BL11 are activated, an operation may be performed on the memory cells MCG2 and MCG3 formed in the holes in the third row.

In an example, during a program operation, the turn-on voltage may be simultaneously applied to the third and fourth drain select lines DSL3 and DSL4, and the turn-off voltage may be applied to the remaining drain select lines. Furthermore, page buffers may be controlled such that a program operation is performed by page buffers coupled to the odd-numbered bit lines BL1, BL3, BL5, BL7, BL9, and BL11, and such that a program operation is not performed by page buffers coupled to even-numbered bit lines BL2, BL4, BL6, BL8, BL10, and BL12. In this process, a program voltage or a verify voltage may be applied to the second word line WL2, and a program pass voltage or a verify pass voltage may be applied to the remaining word lines.

In an example, during a read operation, the turn-on voltage may be simultaneously applied to the third and fourth drain select lines DSL3 and DSL4, and the turn-off voltage may be applied to the remaining drain select lines. Furthermore, page buffers may be controlled such that a read operation is performed by page buffers coupled to the odd-numbered bit lines BL1, BL3, BL5, BL7, BL9, and BL11, and such that a read operation is not performed by page buffers coupled to even-numbered bit lines BL2, BL4, BL6, BL8, BL10, and BL12. In this process, a read voltage may be applied to the second word line WL2, and a read pass voltage may be applied to the remaining word lines.

In this way, an operation of programming the same data to the two memory cells or reading the same data from the two memory cells may be performed on each of the holes in the third row. For example, memory cells MCxa and MCxb formed in the leftmost hole, among the holes in the third row, may form a memory cell pair. In accordance with an embodiment of the present disclosure, the same data may be stored in two memory cells MCxa and MCxb belonging to the memory cell pair, or alternatively, the same data may be simultaneously read from the two memory cells. That is, the two memory cells MCxa and MCxb belonging to the memory cell pair may be operated as if they were one memory cell.

Figure 10A:
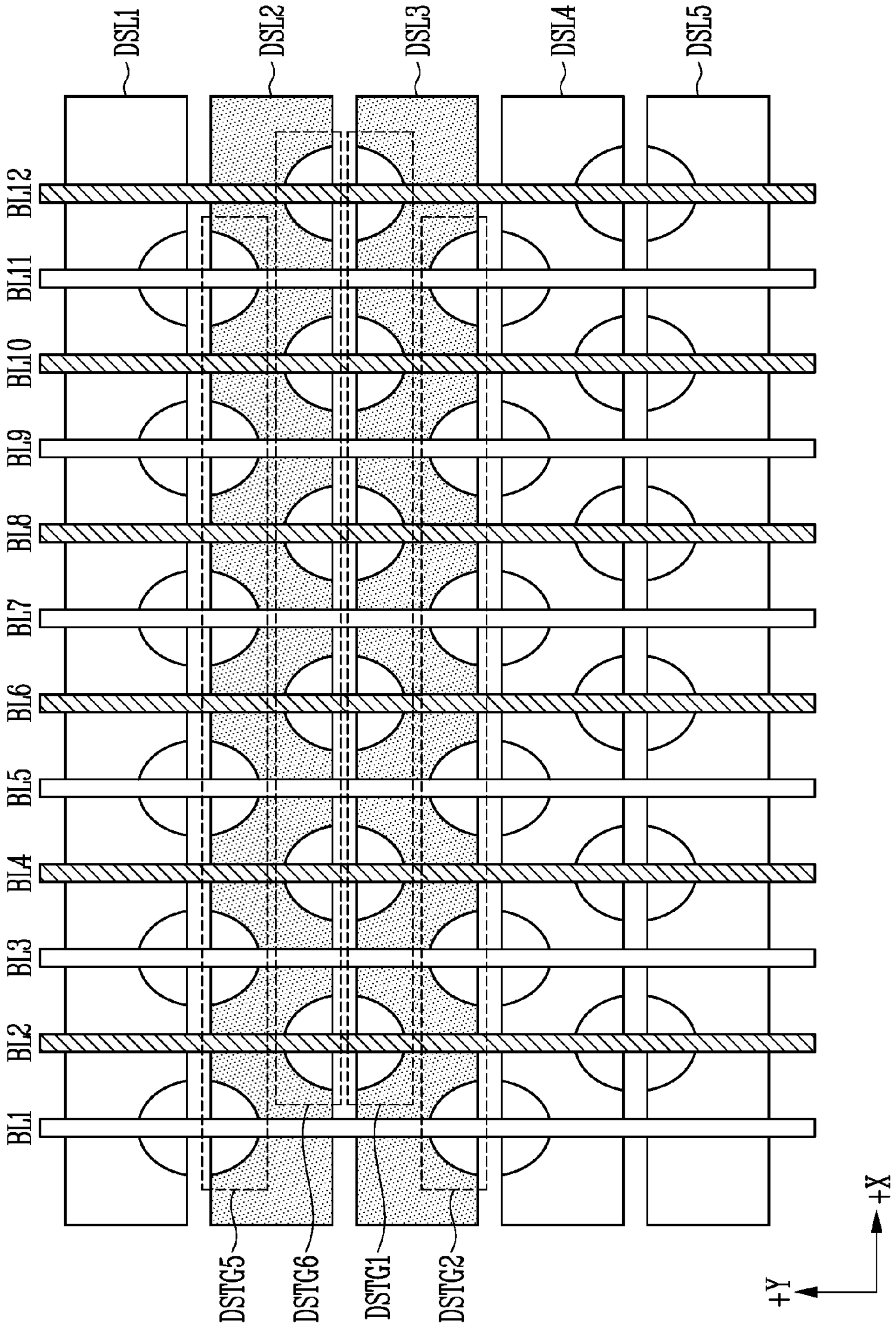
FIG. 10A illustrates a drain select line activated to store the same data in a memory cell pair included in two memory cell strings formed in one hole and even-numbered bit lines corresponding to the drain select line.
Figure 10B:
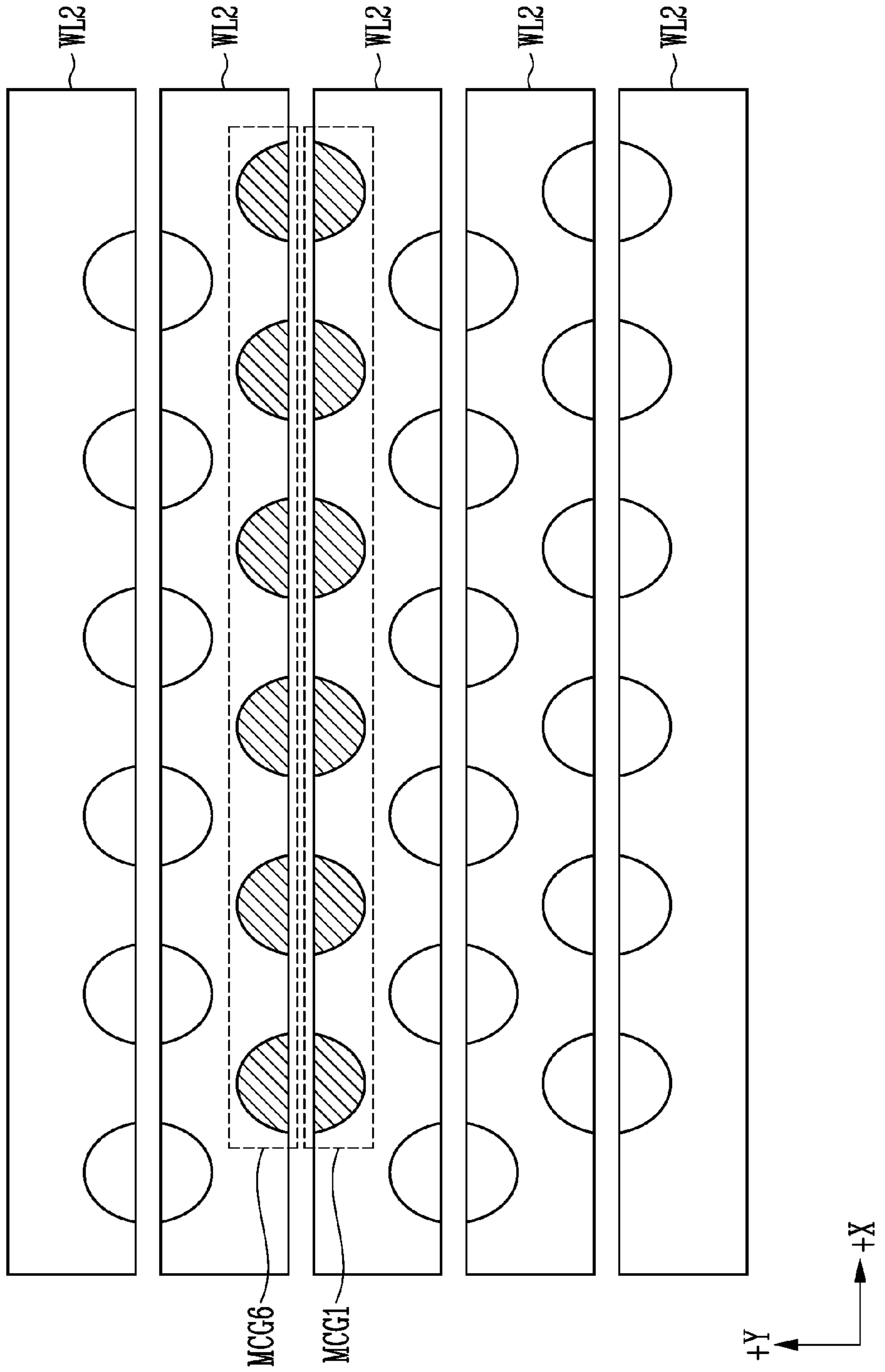
FIG. 10B illustrates memory cells selected by an activated drain select line and activated bit lines in FIG. 10A.

FIG. 10A illustrates a drain select line activated to store the same data in a memory cell pair included in two memory cell strings formed in one hole and even-numbered bit lines corresponding to the drain select line. FIG. 10B illustrates memory cells selected by an activated drain select line and activated bit lines in FIG. 10A. Hereinafter, description will be made with reference to both FIGS. 10A and 10B.

For example, when two memory cell strings formed in each of holes in a second row, among holes illustrated in FIG. 10A, are to be operated as if they were one memory cell string, a second drain select line DSL2 and a third drain select line DSL3 need to be first selected. In this case, all memory cell strings formed in the holes in the second row may be activated. That is, all of the drain select transistors DSTG6 and DSTG1 formed in the holes in the second row may be turned on.

However, drain select transistors DSTG5 adjacent to the second drain select line DSL2, among drain select transistors formed in holes in the first row, and drain select transistors DSTG2 adjacent to the third drain select line DSL3, among drain select transistors formed in holes in a third row, may also be turned on.

In order to deactivate memory cells coupled to the drain select transistors DSTG2 and DSTG5, without deactivating the drain select transistors DSTG1 and DSTG6 formed in the holes in the second row, among the drain select transistors DSTG1, DSTG2, DSTG5, and DSTG6 coupled to the second and third drain select lines DSL2 and DSL3, the bit lines may be selectively activated.

In detail, even-numbered bit lines BL2, BL4, BL6, BL8, BL10, and BL12 may be coupled to the holes in the second row, and odd-numbered bit lines BL1, BL3, BL5, BL7, BL9, and BL11 may be coupled to holes in the first and third rows. Therefore, in order to activate the memory cell strings formed in the holes in the second row, only the even-numbered bit lines BL2, BL4, BL6, BL8, BL10, and BL12 may be activated. As the odd-numbered bit lines BL1, BL3, BL5, BL7, BL9, and BL11 are deactivated, an operation might not be performed on the memory cells coupled to the drain select transistors DSTG2 and DSTG5 even though the drain select transistors DSTG2 and DSTG5 are turned on.

As illustrated in FIG. 10B, in the case in which the second word line WL2 is selected, when the turn-on voltage is applied to the second and third drain select lines DSL2 and DSL3 and the even-numbered bit lines BL2, BL4, BL6, BL8, BL10, and BL12 are activated, an operation may be performed on the memory cells MCG1 and MCG6 formed in the holes in the second row.

In an example, during a program operation, the turn-on voltage may be simultaneously applied to the second and third drain select lines DSL2 and DSL3, and the turn-off voltage may be applied to the remaining drain select lines. Furthermore, page buffers may be controlled such that a program operation is performed by page buffers coupled to the even-numbered bit lines BL2, BL4, BL6, BL8, BL10, and BL12, and such that a program operation is not performed by page buffers coupled to the odd-numbered bit lines BL1, BL3, BL5, BL7, BL9, and BL11. In this process, a program voltage or a verify voltage may be applied to the second word line WL2, and a program pass voltage or a verify pass voltage may be applied to the remaining word lines.

In an example, during a read operation, the turn-on voltage may be simultaneously applied to the second and third drain select lines DSL2 and DSL3, and the turn-off voltage may be applied to the remaining drain select lines. Furthermore, page buffers may be controlled such that a read operation is performed by page buffers coupled to the even-numbered bit lines BL2, BL4, BL6, BL8, BL10, and BL12, and such that a read operation is not performed by page buffers coupled to the odd-numbered bit lines BL1, BL3, BL5, BL7, BL9, and BL11. In this process, a read voltage may be applied to the second word line WL2, and a read pass voltage may be applied to the remaining word lines.

In this way, an operation of programming the same data to the two memory cells or reading the same data from the two memory cells may be performed on each of the holes in the second row.

In accordance with an embodiment of the present disclosure, the memory cell strings may be controlled such that, in the state in which the characteristics of memory cells are good, two memory cell strings formed in one hole may be independently controlled, and in the state in which the characteristics of memory cells are deteriorated, two memory cell strings formed in one hole may be operated as one memory cell string.

In an embodiment, when the number of program-erase operations performed on a semiconductor memory device is less than the specific reference number of times, the characteristics of the memory cells may be considered to be good. Therefore, in this case, the two memory cell strings formed in one hole may be independently controlled. On the other hand, when the number of program-erase operations performed on the semiconductor memory device is equal to or greater than the specific reference number of times, the characteristics of the memory cells may be considered to be deteriorated. Therefore, in this case, the two memory cell strings formed in one hole may be controlled to be operated as one memory cell string.

In an example, when the number of times unrecoverable error occurs in data stored in a specific memory block is equal to or greater than the specific number of times during the operation of the semiconductor memory device, the corresponding memory block may generally be treated as a bad block. However, when the number of times unrecoverable error occurs more than or equal to a specific number of times during the use of two memory cell strings formed in one hole in a memory block while the two memory cell strings are independently controlled, the two memory cell strings formed in one hole in the corresponding memory block may be controlled to be operated as one memory string. Thereafter, when unrecoverable error repeatedly occurs in the corresponding memory block, the corresponding memory block may be treated as a bad block.

In an example, the two memory cell strings formed in one hole may be controlled to be operated as one memory cell string depending on the characteristics of data stored in the memory cell strings. For example, in a system block, metadata associated with the operation of the semiconductor memory device may be stored. In the case of the memory block, the two memory cell strings formed in one hole may be controlled to be operated as one memory cell string.

When the two memory cell strings formed in one hole are controlled to be operated as one memory cell string, each of memory cells in the corresponding memory cell string may be implemented as a single-level cell (SLC) in which one bit of data is stored in one memory cell. By means of this configuration, the stability of stored data may be further improved.

The present disclosure may provide a semiconductor memory device, which has improved operational stability while improving the degree of integration of memory cells.

What is claimed is:

1. A semiconductor memory device comprising:

a plurality of first holes arranged in a first direction spaced apart by a first distance, wherein each of the plurality of first holes includes a first memory cell string and a second memory cell string, and wherein each of the plurality of first memory cell strings and each of the plurality of second memory cell strings include a plurality of first memory cells and a plurality of second memory cells, respectively;

a first drain select line coupled to the plurality of first memory cell strings, among the plurality of first memory cell strings and the plurality of second memory cell strings, the first memory cell string separated from the second memory cell string in each of the plurality of first holes; and a second drain select line coupled to the plurality of second memory cell strings;

wherein the first memory cell strings and the second memory cell strings are connected to a common bit line; and wherein, when the number of program-erase operations performed on the semiconductor memory device is less than a preset reference value, different data are stored in the first memory cells and the second memory cells, and each of the first memory cells and the second memory cells is a multi-level cell in which at least two bits of data are stored; and wherein, when the number of program-erase operations is equal to or greater than the preset reference value, identical data is stored in the first memory cells and the second memory cells, and each of the first memory cells and the second memory cells is a single-level cell in which one bit of data is stored.

2. The semiconductor memory device according to claim 1, wherein, during a program operation performed on the first memory cells and the second memory cells, identical data is stored in the first memory cells and the second memory cells by simultaneously activating the first drain select line and the second drain select line.

3. The semiconductor memory device according to claim 1, wherein, during a read operation performed on the first memory cells and the second memory cells, identical data is read from the first memory cells and the second memory cells by simultaneously activating the first drain select line and the second drain select line.

4. The semiconductor memory device according to claim 1, wherein each of the first memory cells and the second memory cells is a single-level cell in which one bit of data is stored.

5. The semiconductor memory device according to claim 1, wherein, when a number of program-erase operations performed on the semiconductor memory device is less than the preset reference value, different pieces of data are stored in the first memory cells and the second memory cells; and wherein, when the number of program-erase operations is equal to or greater than the preset reference value, identical data is stored in the first memory cells and the second memory cells.

6. A semiconductor memory device comprising:

a plurality of memory blocks, each including a plurality of first holes arranged in a first direction spaced apart by a first distance, wherein each of the plurality of first holes includes a first memory cell string and a second memory cell string, and wherein each of the plurality of first memory cell strings and each of the plurality of second memory cell strings include a plurality of first memory cells and a plurality of second memory cells, respectively;

a peripheral circuit configured to perform a program operation or a read operation on a memory block selected from among the plurality of memory blocks; and a control logic configured to control an operation of the peripheral circuit;

wherein the first memory cell strings are coupled to a first drain select line, among the plurality of first memory cell strings and the plurality of second memory cell strings, the first memory cell string separated from the second memory cell string in each of the plurality of first holes;

wherein the second memory cell strings are coupled to a second drain select line;

wherein the first memory cell strings and the second memory cell strings are connected to a common bit line; and wherein, when the number of program-erase operations performed on the semiconductor memory device is less than a preset reference value, the control logic is configured to control the peripheral circuit to store different data in first memory cells and second memory cells coupled to a selected word line, among memory cells included in the first memory cell strings and the second memory cell strings of the selected memory block, and each of the first memory cells and the second memory cells is a multi-level cell in which at least two bits of data are stored; and wherein, when the number of program-erase operations is equal to or greater than the preset reference value, the control logic is configured to control the peripheral circuit to store identical data in first memory cells and second memory cells coupled to a selected word line, among memory cells included in the first memory cell strings and the second memory cell strings of the selected memory block, and each of the first memory cells and the second memory cells is a single-level cell in which one bit of data is stored.

7. The semiconductor memory device according to claim 6, wherein the control logic is configured to store identical data in the first memory cells and the second memory cells when the number of unrecoverable errors in the memory block is equal to or greater than a reference value.

8. The semiconductor memory device according to claim 7, wherein the control logic is configured to control the peripheral circuit such that, in the memory block in which the number of unrecoverable errors is equal to or greater than the reference value, each of the first memory cells and the second memory cells is operated as a single-level cell in which one bit of data is stored.

9. A semiconductor memory device comprising:

a plurality of first holes arranged in a first direction spaced apart by a first distance; and a plurality of second holes arranged in the first direction spaced apart by the first distance, wherein the plurality of second holes are arranged spaced apart from the plurality of first holes in a second direction that is perpendicular to the first direction and are arranged offset from the plurality of first holes in the first direction by a third distance;

wherein each of the plurality of first holes is separated into first memory cell strings and second memory cell strings, the first memory cell strings are coupled to a first drain select line, the second memory cell strings are coupled to a second drain select line, and the first memory cell strings and the second memory cell strings are coupled to odd-numbered bit lines;

wherein each of the plurality of second holes is separated into third memory cell strings and fourth memory cell strings, the third memory cell strings are coupled to the second drain select line, the fourth memory cell strings are coupled to a third drain select line, and the third memory cell strings and the fourth memory cell strings are coupled to even-numbered bit lines;

wherein, during an operation performed on the first memory cell strings and the second memory cell strings, the first drain select line, the second drain select line, and the odd-numbered bit lines are activated;

wherein, during an operation on the third memory cell strings and the fourth memory cell strings, the second drain select line, the third drain select line, and the even-numbered bit lines are activated, wherein the first memory cell strings and the second memory cell strings are connected to a first bit line;

wherein the third memory cell strings and the fourth memory cell strings are connected to a second bit line; and wherein, when the number of program-erase operations performed on the semiconductor memory device is less than a preset reference value, different data are stored in the first memory cells and the second memory cells, and each of the first memory cells and the second memory cells is a multi-level cell in which at least two bits of data are stored; and wherein, when the number of program-erase operations is equal to or greater than the preset reference value, identical data is stored in the first memory cell strings and the second memory cells, and each of the first memory cells and the second memory cells is a single-level cell in which one bit of data is stored.

10. The semiconductor memory device according to claim 9, wherein, when the number of program-erase operations performed on the semiconductor memory device is less than a preset reference value, identical data is stored in at least one of the first memory cell strings and at least one of the second memory cells coupled to the selected word line, among memory cells included in the first memory cell strings and the second memory cell strings based on a quality of the first memory cell strings and the second memory cells.

11. The semiconductor memory device according to claim 9, wherein identical data is stored in a third memory cell and a fourth memory cell coupled to the selected word line, among memory cells included in the third memory cell strings and the fourth memory cell strings based on a quality of the third memory cells and the fourth memory cells.

12. The semiconductor memory device according to claim 9, wherein:

as the first drain select line and the second drain select line are activated, the first memory cell strings, the second memory cell strings, and the third memory cell strings are activated; and as the odd-numbered bit lines are activated, the operation is performed on the first memory cell strings and the second memory cell strings, among the first memory cell strings, the second memory cell strings, and the third memory cell strings.

13. The semiconductor memory device according to claim 9, wherein:

as the second drain select line and the third drain select line are activated, the second memory cell strings, the third memory cell strings, and the fourth memory cell strings are activated; and as the even-numbered bit lines are activated, the operation is performed on the third memory cell strings and the fourth memory cell strings, among the second memory cell strings, the third memory cell strings, and the fourth memory cell strings.

14. A semiconductor memory device comprising:

a plurality of first holes arranged in a first direction spaced apart by a first distance, wherein each of the plurality of first holes includes a first memory cell string and a second memory cell string; and a plurality of second holes offset in relation to the plurality of first holes, wherein each of the plurality of second holes includes a third memory cell string and a fourth memory cell strings;

wherein an operation is performed on different memory cell strings based on which drain select lines and bit lines are activated;

wherein the two memory cell strings separated from a single hole are connected to a common bit line; and wherein, when the number of program-erase operations performed on the semiconductor memory device is less than a preset reference value, different data are stored in the first memory cells and the second memory cells, and each of the first memory cells and the second memory cells is a multi-level cell in which at least two bits of data are stored; and wherein, when the number of program-erase operations is equal to or greater than the preset reference value, identical data is stored in the first memory cell and the second memory cell, and each of the first memory cells and the second memory cells is a single-level cell in which one bit of data is stored.

15. The semiconductor memory device according to claim 14, wherein the first memory cell strings are coupled to a first drain select line, the second memory cell strings are coupled to a second drain select line, and the first and second memory cell strings are coupled to odd-numbered bit lines;

wherein the third memory cell strings are coupled to the second drain select line, the fourth memory cell strings are coupled to a third drain select line, and the third and fourth memory cell strings are coupled to even-numbered bit lines;

wherein, during an operation performed on the first and second memory cell strings, the first drain select line, the second drain select line, and the odd-numbered bit lines are activated; and wherein, during an operation on the third and fourth memory cell strings, the second drain select line, the third drain select line, and the even-numbered bit lines are activated.

16. The semiconductor memory device according to claim 15, wherein:

as the first drain select line and the second drain select line are activated, the first memory cell strings, the second memory cell strings, and the third memory cell strings are activated; and as the odd-numbered bit lines are activated, the operation is performed on the first memory cell strings and the second memory cell strings, among the first memory cell strings, the second memory cell strings, and the third memory cell strings.

17. The semiconductor memory device according to claim 15, wherein:

as the second drain select line and the third drain select line are activated, the second memory cell strings, the third memory cell strings, and the fourth memory cell strings are activated, and as the even-numbered bit lines are activated, the operation is performed on the third memory cell strings and the fourth memory cell strings, among the second memory cell strings, the third memory cell strings, and the fourth memory cell strings.

* * * * *